US010289166B1

(12) United States Patent
Chang et al.

(10) Patent No.: US 10,289,166 B1
(45) Date of Patent: May 14, 2019

(54) HOUSING FOR ELECTRONIC DEVICE

(71) Applicant: ACER INCORPORATED, New Taipei (TW)

(72) Inventors: Chia-Lun Chang, New Taipei (TW); Chueh-Pin Ko, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/044,522

(22) Filed: Jul. 25, 2018

(30) Foreign Application Priority Data

Dec. 26, 2017 (TW) .............................. 106145693 A

(51) Int. Cl.
*G06F 1/16* (2006.01)
*H05K 5/00* (2006.01)
*H05K 9/00* (2006.01)
*G01K 11/12* (2006.01)
*G06F 3/041* (2006.01)

(52) U.S. Cl.
CPC ............ *G06F 1/1656* (2013.01); *G01K 11/12* (2013.01); *G06F 1/1601* (2013.01); *G06F 1/1643* (2013.01); *G06F 3/041* (2013.01); *H05K 5/0017* (2013.01); *H05K 9/0088* (2013.01)

(58) Field of Classification Search
CPC combination set(s) only.
See application file for complete search history.

(56) References Cited

U.S. PATENT DOCUMENTS

| 5,202,677 | A * | 4/1993 | Parker | G02F 1/0147 349/161 |
| 6,515,857 | B2 * | 2/2003 | Ford | G06F 1/203 313/113 |
| 6,800,106 | B2 * | 10/2004 | Cogar, Sr. | B01D 46/0086 55/385.6 |
| 7,031,148 | B1 * | 4/2006 | Lin | G06F 1/1616 150/154 |
| 7,248,463 | B2 * | 7/2007 | Bander | G06F 1/1607 361/679.27 |
| 7,280,349 | B2 * | 10/2007 | Anderson | G06F 1/181 206/457 |
| 7,929,281 | B2 * | 4/2011 | Szolyga | G06F 1/182 361/679.04 |
| 9,597,825 | B2 * | 3/2017 | Schmidt | B29C 43/222 |
| 2005/0068723 | A1 * | 3/2005 | Squillante | G06F 1/181 361/679.46 |
| 2007/0035739 | A1 * | 2/2007 | Tung | H04M 1/0283 356/445 |
| 2008/0296512 | A1 * | 12/2008 | Caine | H04M 1/0283 250/474.1 |

(Continued)

FOREIGN PATENT DOCUMENTS

TW M261966 4/2005
TW 200906269 2/2009

(Continued)

Primary Examiner — Lisa Lea-Edmonds
(74) Attorney, Agent, or Firm — Winston Hsu

(57) ABSTRACT

A housing for an electronic device, comprising a transparent plate, comprising a first side; a conducting layer, formed on the first side of the transparent plate, for shielding electromagnetic interference generated by the electronic device; and a temperature dependent color-changing layer, formed on the first side of the transparent plate.

15 Claims, 8 Drawing Sheets

(56) References Cited

U.S. PATENT DOCUMENTS

| | | | | |
|---|---|---|---|---|
| 2011/0319137 | A1* | 12/2011 | Takagi | H04B 1/3883 |
| | | | | 455/566 |
| 2014/0213442 | A1* | 7/2014 | Clayton | B41M 5/305 |
| | | | | 503/201 |
| 2015/0286073 | A1* | 10/2015 | Blum | G02C 7/102 |
| | | | | 351/159.66 |
| 2017/0059890 | A1* | 3/2017 | Wilson | G02F 1/0131 |
| 2017/0174983 | A1* | 6/2017 | Odeh | C08L 69/00 |
| 2018/0170013 | A1* | 6/2018 | Hubert | B32B 17/10036 |

FOREIGN PATENT DOCUMENTS

| | | |
|---|---|---|
| TW | 200911074 | 3/2009 |
| TW | I402692 B1 | 7/2013 |

\* cited by examiner

US 10,289,166 B1

HOUSING FOR ELECTRONIC DEVICE

BACKGROUND OF THE INVENTION

1. Field of the Invention

The present invention relates to a housing for electronic device, and more particularly, to a housing for electronic device capable of shielding electromagnetic interference generated by the electronic device and discoloring according to temperature changes of the electronic device.

2. Description of the Prior Art

With development in market of electronic recreation and elevation in user aesthetics, when purchasing an electronic device, more users take exterior looks of the electronic device into consideration rather than performance only. Under such a circumstance, such an amount of desktop and laptop computers have adopted materials different from the conventional metal materials as a housing, so as to provide a different option for the user. Among all materials of forming the housing of the electronic device, the housing of the electronic device made of transparent materials is the most popular kind and well found by most of users.

However, while utilizing transparent materials as the housing of the electronic device, due to characteristic issues, common transparent materials (e.g. glass or acrylic acid) are non-conductive. That is, while utilizing transparent materials as the housing of the electronic device, electromagnetic interference generated by the electronic device may not be shielded effectively, resulting in violations of the electromagnetic interference regulation limit. Despite electromagnetic interference may influence general communications, and even worse, the electronic device utilizing transparent materials as the housing may be prohibited from marketing.

Therefore, how to provide a transparent and beautiful housing of the electronic device which meets regulations of the electromagnetic interference to the user is a significant objective in the field.

SUMMARY OF THE INVENTION

It is therefore a primary objective of the present invention to provide a housing for electronic device, capable of shielding the electronic device and providing a beautiful external case for the electronic device to the user, so as to beautify the housing to improve above-mentioned problems of the prior art.

The present invention provides a housing for an electronic device, comprising a transparent plate, comprising a first side; a conducting layer, formed on the first side of the transparent plate, for shielding electromagnetic interference generated by the electronic device; and a temperature dependent color-changing layer, formed on the first side of the transparent plate.

The present invention further provides a housing for an electronic device, comprising a transparent plate, comprising a first side and a second side; a conducting layer, formed on the first side of the transparent plate, for shielding electromagnetic interference generated the electronic device; and a temperature dependent color-changing layer, formed on the second side of the transparent plate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
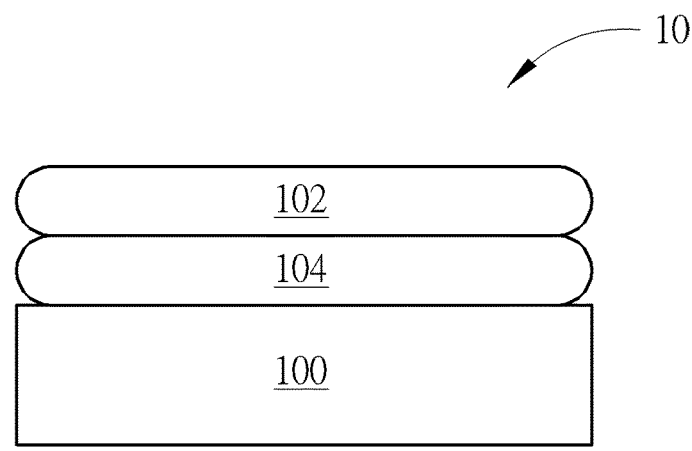
FIG. 1 is a schematic diagram of a sectional side view of a housing according to an embodiment of the present invention.

Please refer to FIG. 1, which is a schematic diagram of a sectional side view of a housing 10 according to an embodiment of the present invention. The housing 10 is disposed on an electronic device as an external case of the electronic device, so as to effectively shield electromagnetic interference generated by the electronic device and beautify exterior looks of the electronic device. For example, the housing 10 may be disposed on a desktop computer or a laptop for improving the exterior design of the electronic device and electromagnetic interference shielding. In detail, the housing 10 includes a transparent plate 100, a conducting layer 102 and a temperature dependent color-changing layer 104. The transparent plate 100 is made of a transparent material. For example, the transparent plate 100 may be made of the material selected from a material of glass, plastic, acrylic acid, polyethylene terephthalate (PET) or polycarbonate (PC), and is not limited herein. The transparent plate 100 is utilized for providing enough hardness and thickness for the housing 10, so as to cover the electronic device while keeping the housing 10 transparent. The transparent plate 100 includes a first side and a second side. When the transparent plate is disposed on the electronic device, the first side of the transparent plate 100 corresponds to the inside of the electronic device and the second side of the transparent plate 100 corresponds to the outside of the electronic device. The conducting layer 102 is formed on the first side of transparent plate 100, i.e. corresponding to the inside of the electronic device, for shielding electromagnetic interference generated by the electronic device, such that the electronic device may conform to regulations of the electromagnetic interference (EMI). For example, the conducting layer 102 may be made of a material selected from indium tin oxide (ITO), metal mesh, and is not limited herein. The conducting layer 102 may be made of any other transparent or translucent conductive materials for shielding electromagnetic interference generated by the electronic device and providing transparent external looks for the housing 10, which is also within the scope of the present invention. In an embodiment, the temperature dependent color-changing layer 104 is formed on the first side of the transparent plate 100, and is formed between the transparent plate 100 and the conducting layer 102. The temperature dependent color-changing layer 104 may change its color according to temperature change of the electronic device. For example, a color changing range of the temperature dependent color-changing layer 104 may be within 0° C.-70° C. The color of the of the temperature dependent color-changing layer 104 may change to black, blue, silver, red, transparent or other colors. It is noted that the color changing range and the color changing type of the temperature dependent color-changing layer 104 are not limited in the present invention, and may be altered or modified according to different requirements of the user or the electronic device, which is also within the scope of the present invention. For example, when the housing 10 is disposed on a side face of the electronic device as the side plate of the electronic device and an operation temperature of the electronic device is at about 50° C., the color changing range of the temperature dependent color-changing layer 104 may accordingly be altered to 45° C. Under such a circumstance, when the electronic device is at room temperature (28° C.), the color of the temperature dependent color-changing layer 104 may be black and opaque; when the electronic device is on and temperature of the electronic device is increased to the operation temperature (50° C.), the color of the temperature dependent color-changing layer 104 may be changed to transparent, such that the user may see through the housing 10. Under such a circumstance, through the conducting layer 102 and the temperature dependent color-changing layer 104 of the housing 10, the housing 10 not only provides beautiful external case for the electronic device but also provides the electromagnetic interference shielding, such that the electronic device may conform to regulations of the electromagnetic interference.

Figure 2:
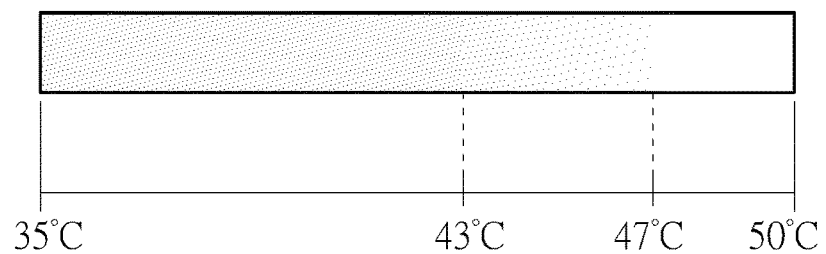
FIG. 2 is a schematic diagram of a discoloration of the temperature dependent color-changing layer according to an embodiment of the present invention

More specifically, please refer to FIG. 2, which is a schematic diagram of a discoloration (color change) of the temperature dependent color-changing layer 104 at different temperature according to an embodiment of the present invention. FIG. 2 illustrates how color of the temperature dependent color-changing layer 104 changes at different temperature. In an embodiment, assuming the color changing range of the temperature dependent color-changing layer 104 is set within 43° C.-47° C. Thus, when temperature of the temperature dependent color-changing layer 104 is at 35° C., the color of the temperature dependent color-changing layer 104 is black and opaque; when temperature is increased to 43° C., the color of the temperature dependent color-changing layer 104 is changed and becomes lighter; when temperature is increased to 47° C., the color of the temperature dependent color-changing layer 104 is changed to completely transparent and colorless. Until then, the color of the temperature dependent color-changing layer 104 is completely transformed, such that the color of the temperature dependent color-changing layer 104 will not be changed even if temperature goes up to 50° C. or above. It is noted that, within the color changing range (i.e. 43° C.-47° C.) of the temperature dependent color-changing layer 104, the color of the temperature dependent color-changing layer 104 changes from black and opaque to colorless and transparent gradually and continuously. That is, the discoloration of the temperature dependent color-changing layer 104 gradually and transiently changes the color and transparency of the temperature dependent color-changing layer 104 during changes of temperature. Under such a circumstance, when the housing 10 is disposed on the electronic device, the color of the temperature dependent color-changing layer 104 of the housing 10 may be changed according to operation temperature variations of the electronic device, such that a variety of exterior looks may be generated to beautify the electronic device and efficiently improve user experience. For example, when the electronic device is off and temperature of the electronic device is at room-temperature (lower than 38° C.), the color of the temperature dependent color-changing layer 104 may be black and opaque; when the electronic device is on and temperature of the electronic device reaches the preset color changing range (greater than 42° C.), the color of the temperature dependent color-changing layer 104 may be changed to transparent, and the user may observe interior structure of the electronic device through the housing 10, thus creating different exterior looks of the electronic device and improving user satisfaction.

Figure 3A:
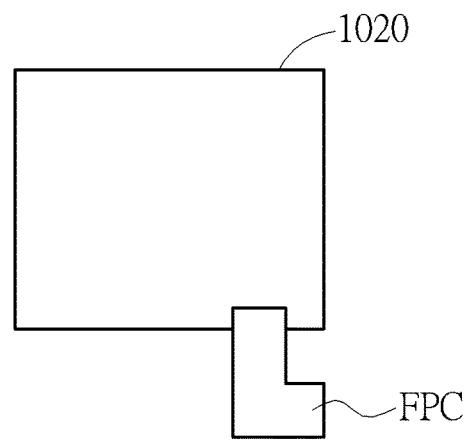
FIGS. 3A and 3B are schematic diagrams of a conducting layer and a conducting layer according to embodiments of the present invention.
Figure 3B:
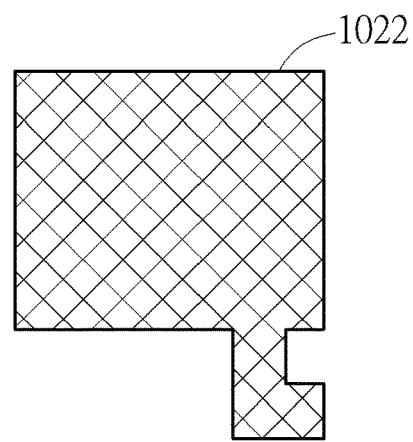

In addition, in order to shield electromagnetic interference generated by the electronic device, the conducting layer 102 of the housing 10 may be connected to ground. Please refer to FIGS. 3A and 3B, which are schematic diagrams of a conducting layer 1020 and a conducting layer 1022 according to embodiments of the present invention. As shown in FIG. 3A, the conducting layer 1020 is made of ITO, and the conducting layer 1020 may not directly connect to an external device, such as a housing or other external devices. Therefore, for shielding electromagnetic interference generated by the electronic device, there is necessity to dispose a flexible printed circuit (FPC) on the conducting layer 1020 so that the conducting layer 1020 is connected to the housing or external voltage sources through the FPC. In addition, as shown in FIG. 3B, the conducting layer 1022 is made of metal mesh, and the conducting layer 1022 may directly connect to the housing or other external devices. As such, there is no necessity to dispose an additional component for connection, wherein the conducting layer 1022 is able to deliver a sensing signal generated by the conducting layer 1022 or to receive a certain voltage from the conducting layer 1022.

In brief, through disposing the housing 10 of the present invention externally on the electronic device, electromagnetic interference generated by the electronic device may be effectively shielded, such that the electronic device may conform to regulations of the electromagnetic interference. In addition, with temperature changes generated by operations of the electronic device, the color showed by the temperature dependent color-changing layer 104 of the housing 10 may be accordingly changed, for providing a variety of exterior looks according to temperature, so as to provide different exterior looks of the electronic device for customers.

Figure 4A:
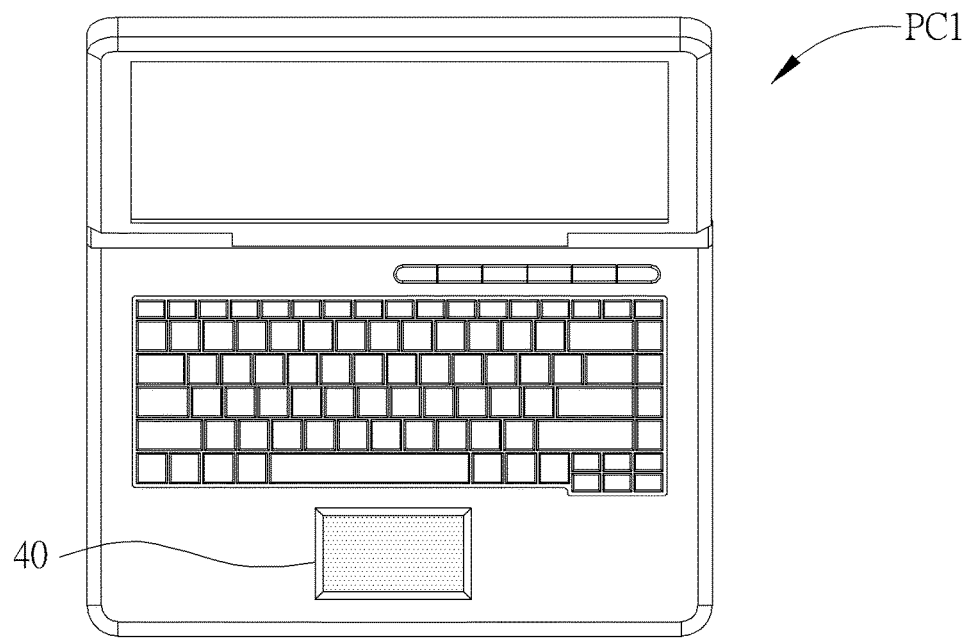
FIGS. 4A and 4B are schematic diagrams of a housing disposed on an electronic device according to an embodiment of the present invention.
Figure 4B:
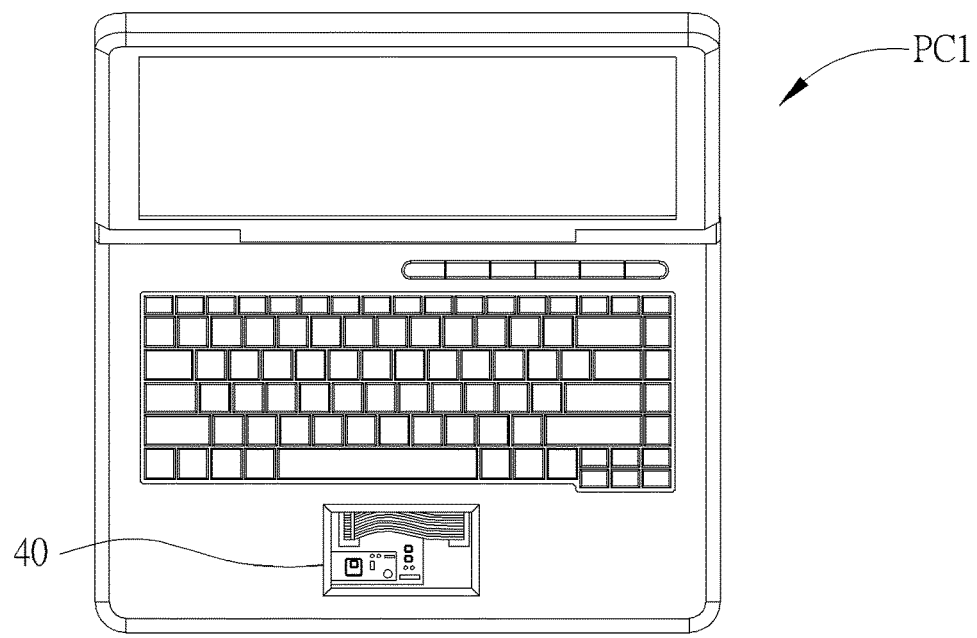

In another aspect, the housing may be disposed as a case of the electronic device. Moreover, the housing may be a touch panel of the electronic device such that the housing can receive a touch operation of the user and accordingly generate a touch signal due to its electric conductivity. More specifically, please refer to FIGS. 4A and 4B, which are schematic diagrams of a housing 40 disposed on an electronic device PC1 according to embodiments of the present invention. The electronic device PC1 may be a laptop. The housing 40 is utilized as a touch panel of the electronic device PC1. As shown in FIG. 4A, when the electronic device PC1 is off and not running, the color displayed by the housing 40 is black and opaque; as shown in 4B, when the electronic device is on and running, the housing 40 may be utilized by the user for touch operation and the color displayed by the housing 40 may be changed from black and opaque to transparent based on the variation of the human body of the user, such that the user may directly see through the housing 40 to view the inside of the electronic device PC1. Under such a circumstance, the color changing range of the temperature dependent color-changing layer 104 of the housing 40 may be preferably adjusted. For example, the color changing range of the temperature dependent color-changing layer 104 may be adjusted to 28° C.-32° C. according to temperature of human body. As such, when the housing 40 is utilized by the user for touch operation, the temperature dependent color-changing layer 104 may be heated by fingers of the user, and the color of the temperature dependent color-changing layer 104 may be gradually changed to transparent when the temperature falls within the color changing range (e.g. 28° C.-32°).

Figure 5:
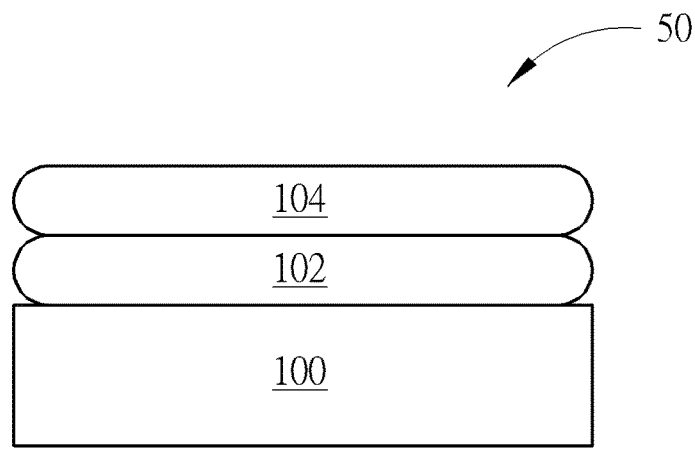
FIGS. 5 and 6 are schematic diagrams respectfully showing a sectional side view of a housing according to alternative embodiments of the present invention.
Figure 6:
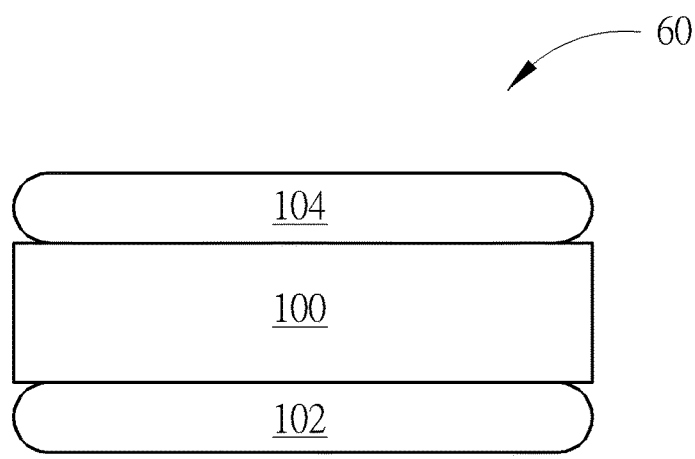

Notably, the embodiments stated in the above are utilized for illustrating the concept of the present invention. Those skilled in the art may make modifications and alterations accordingly, and not limited herein. For example, please refer to FIGS. 5-6. FIGS. 5 and 6 are schematic diagrams of sectional side views of a housing 50 and a housing 60 according to embodiments of the present invention. The housing 50 and the housing 60 are similar to the housing 10, and thus, the same components are denoted by the same symbols. Compared with the housing 10, the housing 50, 60 have different arrangement orders for the transparent plate 100, the conducting layer 102 and the temperature dependent color-changing layer 104. In detail, as shown in FIG. 5, the conducting layer 102 and the temperature dependent color-changing layer 104 of the housing 50 are formed on the first side of the transparent plate 100, and the conducting layer 102 is formed between the transparent plate 100 and the temperature dependent color-changing layer 104. As shown in FIG. 6, the conducting layer 102 is formed on the first side (i.e. corresponding to the inside of the electronic device) of the transparent plate 100, the temperature dependent color-changing layer 104 is formed on the second side (i.e. corresponding to the outside of the electronic device) of the transparent plate. In brief, the present invention does not limit where the temperature dependent color-changing layer 104 is disposed, as long as the conducting layer 102 is disposed on the first side (i.e. corresponding to the inside of the electronic device) of the transparent plate 100.

Figure 7:
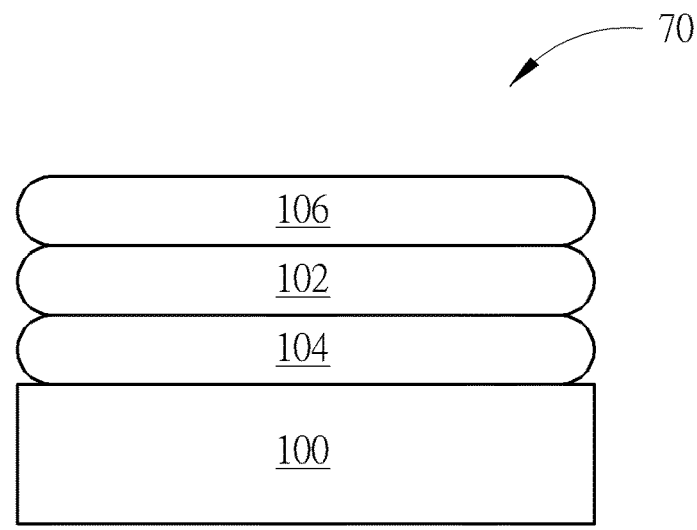
FIGS. 7-9 are schematic diagrams of housings according to alternative embodiments of the present invention.
Figure 8:
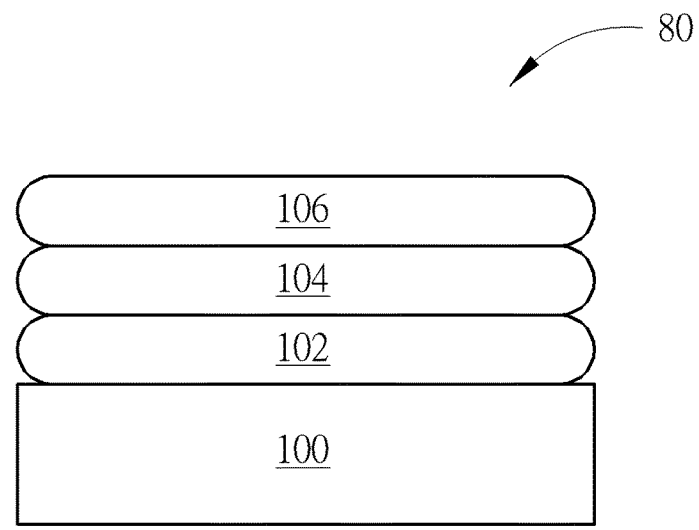
Figure 9:
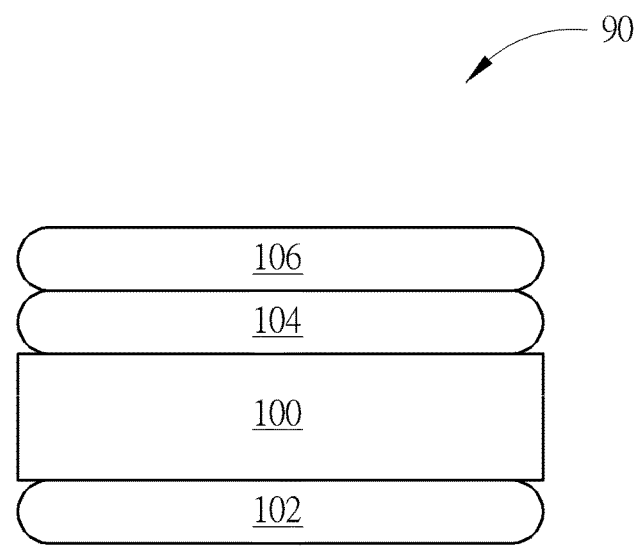

In another aspect, for increasing the variety of exterior looks of the housings 10, 50, 60, a bottom layer may further be applied to generate different exterior looks when the colors of the housings 10, 50, 60 are changed. Please refer to FIGS. 7-9, which are schematic diagrams of a housing 70, a housing 80, a housing 90 according to embodiments of the present invention. The housing 70, 80, 90 are similar to the housing 10, and thus, the same components are denoted by the same symbols. Different from the housing 10, the housings 70, 80, 90 further include a bottom layer 106 disposed on the first side of the transparent plate 100. In detail, as shown in FIG. 7, the housing 70 is similar to the housing 10 and further includes the bottom layer 106. The bottom layer 106 is disposed on the first side of the transparent plate 100, such that the conducting layer 102 is formed between the temperature dependent color-changing layer 104 and the bottom layer 106. As shown in FIG. 8, the housing 80 is similar to the housing 50 and further includes the bottom layer 106 on the first side of the transparent plate 100, such that the temperature dependent color-changing layer 104 is formed between the conducting layer 102 and the bottom layer 106. As shown in FIG. 9, the housing 90 is similar to the housing 60 and further includes the bottom layer 106 on the first side of the transparent plate 100, such that the conducting layer 102 is formed between the transparent plate 100 and the bottom layer 106. In brief, the bottom layer 106 is formed on the transparent plate 100 corresponding to the inside of the electronic device, and disposed as the innermost layer of the housings 70, 80, 90 corresponding to the electronic device. As such, when the housings 70, 80, 90 are transparent, the user may see a pattern of the bottom layer 106, elevating a diversity of the housing 70, 80, 90 while the colors are changed.

Figure 10A:
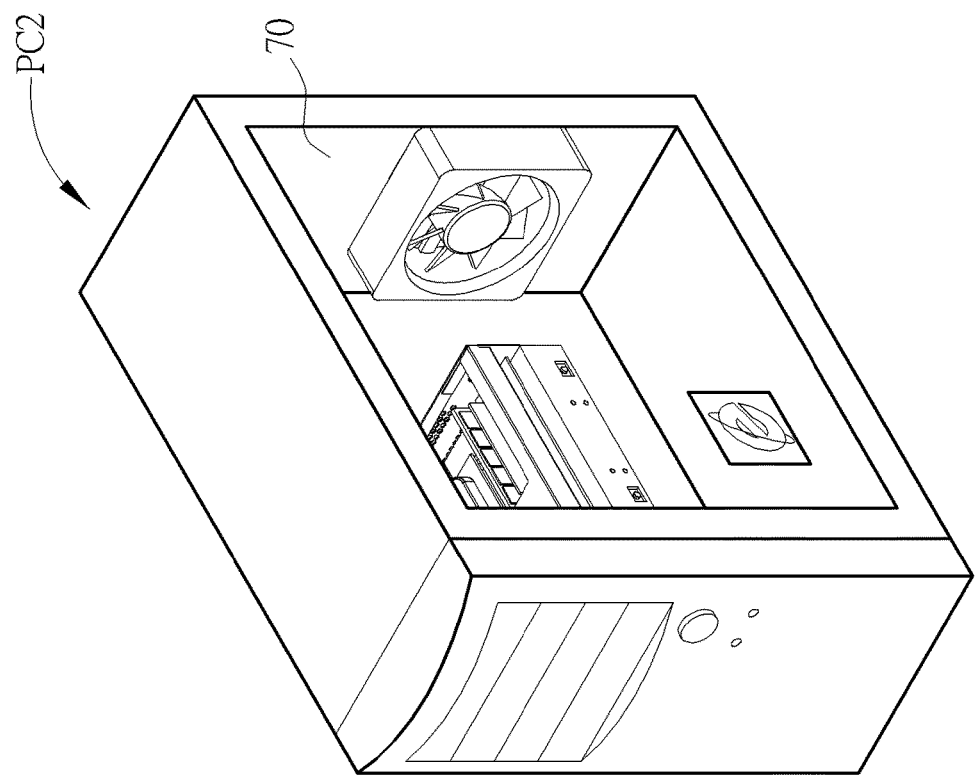
FIGS. 10A and 10B are schematic diagrams of the housing shown in FIGS. 7-8 and disposed on an electronic device according to alternative embodiments of the present invention.
Figure 10A:
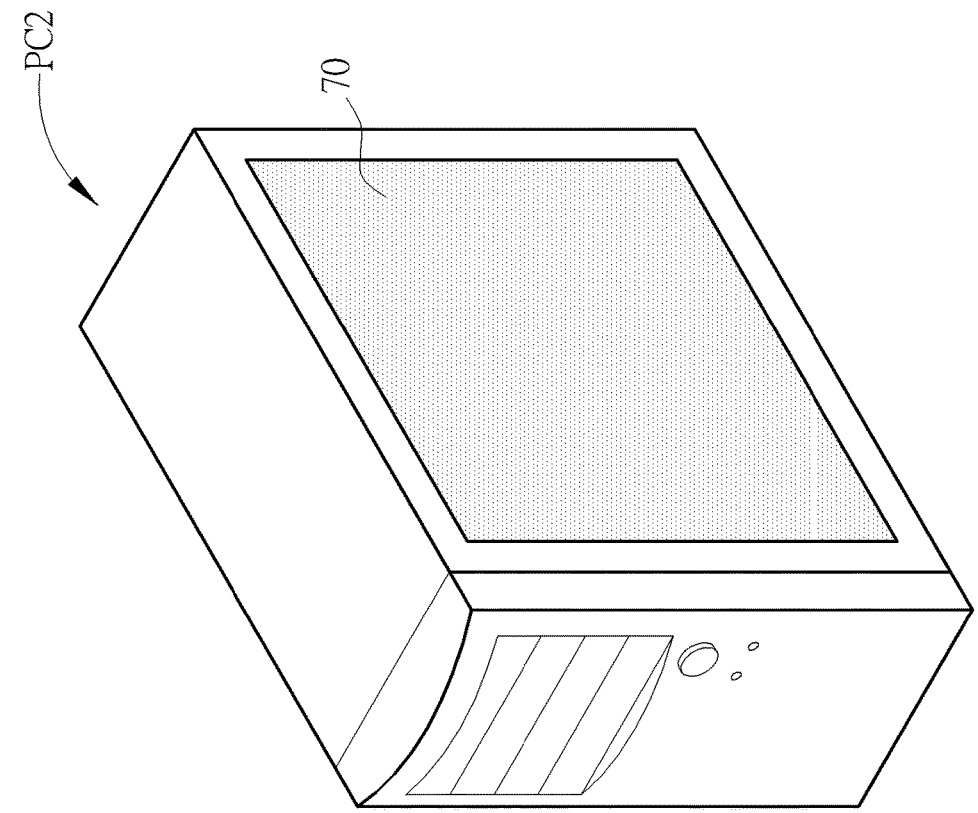
Figure 10B:
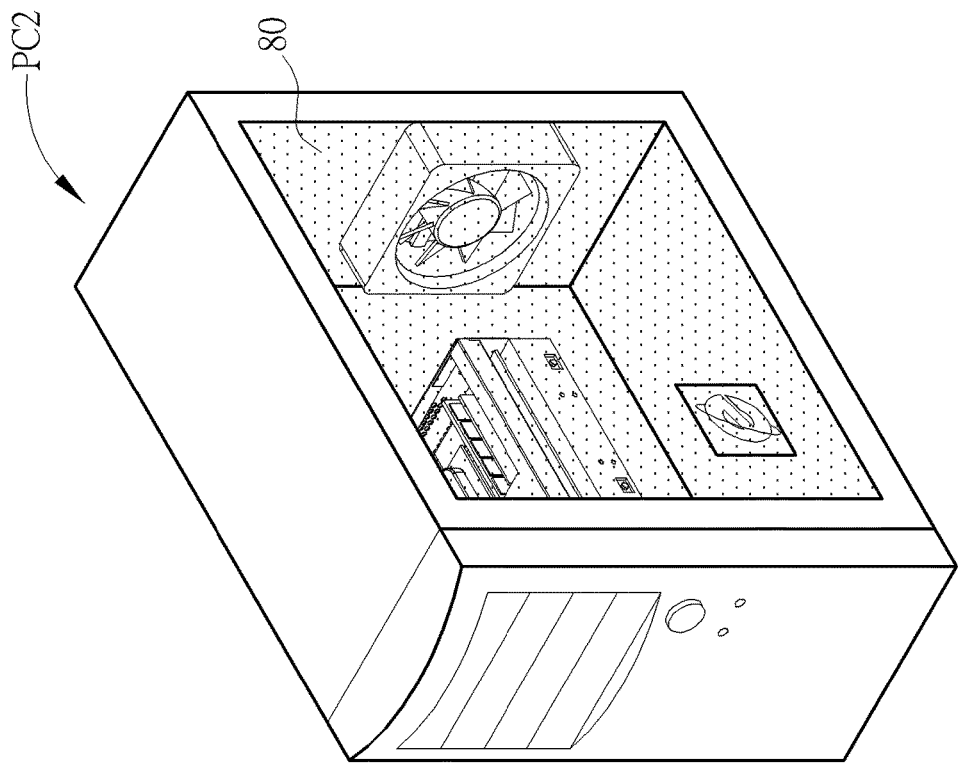
Figure 10B:
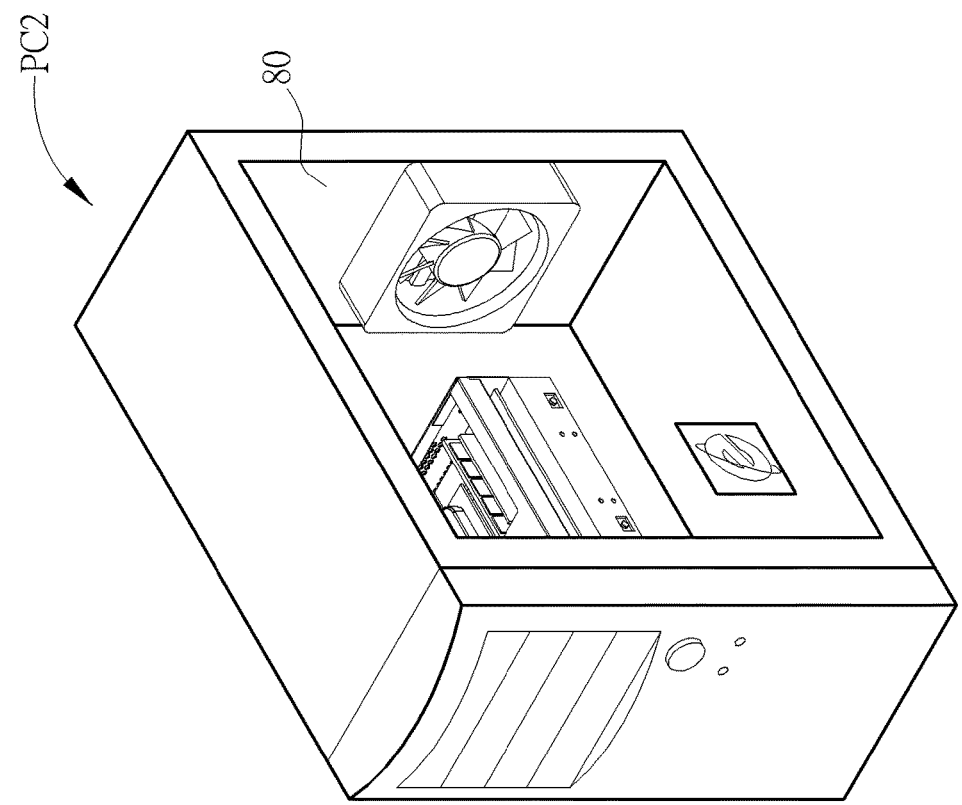

Furthermore, please refer to FIGS. 10A and 10B, which are schematic diagrams of the housing 70 and the housing 80 being disposed on an electronic device PC2 according to embodiments of the present invention. As shown in FIG. 10A, the color of the temperature dependent color-changing layer 104 of the housing 70 is black and opaque at room temperature; when the electronic device PC2 is turned on and temperature of the electronic device PC2 reaches the operation temperature, the color of the temperature dependent color-changing layer 104 of the housing 70 is changed to transparent, revealing the pattern of bottom layer 106 to the user. In addition, as shown in FIG. 10B, when the electronic device PC2 is turned off and temperature of the electronic device PC2 is at room temperature, the color of the temperature dependent color-changing layer 104 of the housing 80 is transparent, and thus, revealing the pattern of the bottom layer 106; when the electronic device PC2 is turned on and temperature of the electronic device PC2 reaches the operation temperature, the color of the temperature dependent color-changing layer 104 of the housing 80 is changed to red and translucent. The pattern of the bottom layer 106 may be discolored according to temperature changes of the temperature dependent color-changing layer 104, creating different exterior looks of the housing 80.

Compared to the prior art, the conventional transparent housing of the electronic device may only provide functions of covering the electronic device. Despite electromagnetic interference generated by the electronic device may not be shielded properly, exterior looks of the electronic device is also dreary. In contrast, an embodiment of the housing of the present invention may provide the user a variety of exterior looks through temperature changes along with properly shielding electromagnetic interference generated by the electronic device, so as to beautify exterior looks and functionality of the housing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A housing for an electronic device, comprising:
a transparent plate, comprising a first side;
a conducting layer, formed on the first side of the transparent plate, for shielding electromagnetic interference generated by the electronic device; and
a temperature dependent color-changing layer, formed on the first side of the transparent plate.

2. The housing of claim 1, wherein the transparent plate is made of a material selected from a material of glass or a material of plastic.

3. The housing of claim 1, wherein when a user performs a touch operation on the housing, the conducting layer transmits a touch signal generated by sensing the touch operation of the user.

4. The housing of claim 1, wherein the conducting layer is made of indium tin oxide (ITO) or metal mesh.

5. The housing of claim 4, wherein when the conducting layer is made of indium tin oxide, the conducting layer further comprises a bonding pad, for connecting the conducting layer to a ground voltage to shield electromagnetic interference, or connecting the conducting layer to a receiving end to transmit signal.

6. The housing of claim 1, wherein the temperature dependent color-changing layer is formed between the transparent plate and the conducting layer.

7. The housing of claim 6, further comprising a bottom layer, formed on the first side of the transparent plate, wherein the conducting layer is formed between the temperature dependent color-changing layer and the bottom layer.

8. The housing of claim 1, wherein the conducting layer is formed between the transparent plate and the temperature dependent color-changing layer.

9. The housing of claim 8, further comprising a bottom layer, formed on the first side of the transparent plate, wherein the temperature dependent color-changing layer is formed between the conducting layer and the bottom layer.

10. A housing for an electronic device, comprising:
a transparent plate, comprising a first side and a second side;
a conducting layer, formed on the first side of the transparent plate, for shielding electromagnetic interference generated the electronic device; and
a temperature dependent color-changing layer, formed on the second side of the transparent plate.

11. The housing of claim 10, wherein the transparent plate is made of a material selected from a material of glass or a material of plastic.

12. The housing of claim 10, wherein when a user performs a touch operation on the housing, the conducting layer transmits a touch signal generated by sensing the touch operation of the user.

13. The housing of claim 10, wherein the conducting layer is made of indium tin oxide or metal mesh.

14. The housing of claim 13, wherein when the conducting layer is made of indium tin oxide, the conducting layer further comprises a bonding pad, for connecting the conducting layer to a ground voltage to shield electromagnetic interference, or connecting the conducting layer to a receiving end to transmit signal.

15. The housing of claim 10, further comprising a bottom layer, formed on the first side of the transparent plate, wherein the conducting layer is formed between the transparent plate and the bottom layer.

* * * * *